United States Patent
Persoon

(10) Patent No.: US 7,263,018 B2
(45) Date of Patent: Aug. 28, 2007

(54) COMPENSATING A LONG READ TIME OF A MEMORY DEVICE IN DATA COMPARISON AND WRITE OPERATIONS

(75) Inventor: Eric Hendrik Jozef Persoon, Eindhoven (NL)

(73) Assignee: NXP B.V., Eindhoven (NL)

( * ) Notice: Subject to any disclaimer, the term of this patent is extended or adjusted under 35 U.S.C. 154(b) by 8 days.

(21) Appl. No.: 10/565,149

(22) PCT Filed: Jul. 12, 2004

(86) PCT No.: PCT/IB2004/051197

§ 371 (c)(1),
(2), (4) Date: Jan. 19, 2006

(87) PCT Pub. No.: WO2005/008675

PCT Pub. Date: Jan. 27, 2005

(65) Prior Publication Data

US 2006/0248258 A1 Nov. 2, 2006

(30) Foreign Application Priority Data

Jul. 22, 2003 (EP) .................................. 03102247

(51) Int. Cl.
*G11C 7/00* (2006.01)

(52) U.S. Cl. ....................................... 365/220; 365/219

(58) Field of Classification Search ................ 365/220, 365/219, 158, 173
See application file for complete search history.

(56) References Cited

U.S. PATENT DOCUMENTS

| 5,481,670 A * | 1/1996 | Hatashita et al. ............... 714/7 |
| 6,052,302 A | 4/2000 | Moyer et al. |
| 6,545,906 B1 | 4/2003 | Savtchenko et al. |
| 6,785,154 B2 * | 8/2004 | Sunaga et al. .............. 365/100 |
| 2002/0159286 A1 | 10/2002 | Sunaga et al. |
| 2003/0090934 A1 | 5/2003 | Iwata |
| 2006/0209600 A1 * | 9/2006 | Le Phan ................ 365/189.01 |

* cited by examiner

Primary Examiner—Richard T. Elms
Assistant Examiner—Hien N Nguyen

(57) ABSTRACT

A memory device is disclosed that has a longer read time than write time and implements a parallel-read operation. The parallel-read operation saves reading time and thus accelerates a write operation that comprises a step of comparing incoming data with memory data that were stored in the memory before. The arrangement is especially applicable to an MRAM memory with 0T1MTJ memory cells. The parallel-read operation involves reading in parallel a large amount of data or all data to be compared from the memory into a first temporary memory. The write data is stored in a second temporary memory. The memory data contained in the first temporary memory is compared with the corresponding write data contained in the second temporary memory and allocated to the same address information. Only that write data is written to the memory, which is different from the corresponding memory data.

18 Claims, 2 Drawing Sheets

COMPENSATING A LONG READ TIME OF A MEMORY DEVICE IN DATA COMPARISON AND WRITE OPERATIONS

The invention concerns a memory device with a long read time compared to the write time and a method for comparing data stored in memory sections of a such a memory with incoming data included in a write request.

New memory technologies such as Magneto-resistive random access memory (MRAM) and Ferroelectric RAM (FeRAM) have attracted growing attention due to their potential to combine non-volatile storage with a bundle of useful properties of present memory technologies, such as high density, high speed, low power consumption and low cost.

A well-known MRAM technology is based on memory cells that comprise a layer structure with a magnetic tunnelling junction (MTJ) element between two crossing electrodes. The memory cells are typically arranged in the form of a matrix. The electrodes are referred to as bit line and word line. The MTJ element acts as a programmable resistor having two distinct resistance values.

In a write operation a memory cell is selected by passing a current through both the bit line and the word line. At their crossing point the two magnetic fields caused by the word line and bit line currents interact with the magnetic moment of the layers of the MTJ element. The two fields add to a field that is strong enough to switch the MTJ element at the intersection of the selected word line and the selected bit line between resistive states. The resistive state that is programmed into the cell depends on the direction of the current in the bit line.

In a read operation a small sense current is applied to the selected bit line in order to ascertain the resistance state of a selected memory cell. To ensure that the sense current only flows through the selected cell, a selection element such as a transistor is connected with each memory cell between the bit line and a third electrode, referred to as the base electrode. The selection transistor of the selected memory is switched into a conductive state when applying a sense voltage to the selected bit line and the selected base electrode. Since the selection transistors of all other memory cells block a current flow through them, the sense current only flows through the cell at the intersection of the activated bit line and the base electrode. Depending on the resistive state of this memory cell, the sense current takes on one of two possible current values, which are indicative of the two possible bit values that can be stored in the memory cell. A memory cell comprising one selection transistor in combination with an MTJ element is referred to as a 1T1MTJ memory cell.

The main drawback of MRAM devices based on 1T1MTJ memory cells is that the density of memory cells is lower than that of competing semiconductor memory devices. This is due to the large size of the memory cells and mainly caused by the selection transistor. The selection transistor is much larger than the MTJ element of the memory cell it belongs to. Omitting the transistor of the memory cells allows a much higher cell density that is comparable to that of semiconductor memory devices and can even be larger by employing a three-dimensional array of cells. Memory cells with one MTJ element and no transistor are referred to as 0T1MTJ memory cells.

A first major drawback of 0T1MTJ memory cells is that omitting the transistor removes the selectivity of a read operation. In a 0T1MTJ memory, the sense current of a read operation is split into contributions from several current paths through neighbouring cells that establish a connection between the activated bit line and the word line. Each path includes a different memory cell, since there is no way to deselect any memory cell. Therefore, it is difficult to determine the state of a specific memory cell in the read operation. This problem is herein also referred to as the leakage problem.

All known solutions to this problem consequently result in a longer time span for reading. The time span needed to determine the bit value contained in a memory cell is also referred to as the read time. Read times of 0T1MTJ memory cells are currently in the order of magnitude of one microsecond. One solution is for instance to read the state of a memory cell by first reading, then writing to the cell, reading again and comparing with the previous state. If a difference is detected, the original value is restored by another writing step. It is obvious that this type of read operation takes much longer time than a write operation. The time span needed to perform a write operation is referred to as the write time. When speaking of a comparison of the read time of a memory device with the write time or the read time of another memory device, it is assumed that the operations to be compared involve a similar or equal amount of data.

Another major drawback of 0T1MTJ memory cells is that the long read time prevents the use of power-saving write methods known from 1T1MTJ-based memory devices. Such power-saving write methods make use of a comparison of incoming write data with stored memory data. In detail, write data received with a write request is compared with the data already stored in the memory cells that correspond to the address data received with the write request. After the comparison, only those memory cells are overwritten, that store bit values different from the respective write data.

A write operation making use of such a comparison will be referred to herein as a conditional write operation. In a conditional write operation, only a fraction of memory cells addressed by a write request is actually overwritten with different values. Power is saved because the power needed for a write operation comprising a read, compare and conditional write process as described, is less than the power spent for unconditionally overwriting all addressed memory cells without comparing first.

A prior art MRAM memory device implementing a power-saving method for writing to a non-volatile memory with 1T1MTJ memory cells is described in US 2002/0159286 A1.

In US 2002/0159286 A1, this method is implemented using a read data latch and a write data latch. Memory data from the memory cells addressed by a current write request is temporarily stored in the read data latch. Incoming write data is temporarily stored in the write data latch. A data comparator circuit compares the write data and the memory data allocated to the same memory address. If the corresponding data is identical, the write operation ends. If the corresponding data is different, a word line driver and a bit line driver are activated to select and overwrite the respective memory cell.

The writing method of US 2002/0159286 A1 inherently makes use of the fact that the difference between the write time required for a conditional write operation on one side and an unconditional write operation on the other side is negligible. Employing the power-saving write method in a memory device with 0T1MTJ memory cells, or, generally speaking, in any memory device with a long read time compared to the write time, would slow down the conditional write operation beyond the long time span already needed for a read operation. This would render the memory device a poor competitor with existing semiconductor technologies such as Flash memory.

In summary, current MRAM technology, on one hand, provides a rather low cell density compared with competing semiconductor technologies. High-density MRAM devices, on the other hand, can only be provided at the cost of a long read time. A long read time prevents the use of a write operation that involves a reading step, for instance for a comparison with previously stored data, and especially in order to save power in a write operation.

While a long read time can be acceptable for instance in bulk data storage, high power consumption would be a major disadvantage in comparison with existing technologies.

It is an object of the present invention to provide a memory device with a long read time, which at least partially compensates the mentioned drawbacks of a read time that is long in comparison with the write time.

It is another object of the present invention to provide a method for comparing data with memory data stored in memory sections of the memory that is useful also in a memory device with a slow read access compared with the write access.

According to a first aspect of the invention, a memory device is provided that comprises
  a memory for storing memory data in memory sections allocated to address information, said memory having a long read time compared to a write time
  a read control unit coupled with said memory and adapted to read in parallel memory data from a plurality of sections or from all sections of the memory that are defined by address data contained in an incoming write request,
  at least one first temporary memory adapted to receive in parallel and store memory data read by the read control unit,
  at least one second temporary memory adapted to store data contained in the incoming write request directed to said memory,
  a comparator unit coupled with said first and second temporary memories and adapted to compare memory data stored in the first temporary memory with write data stored in the second temporary memory and allocated to the same address information, and to provide at its output a signal indicative of the result of the respective comparison.

The memory device of the first aspect of the invention is based on the general idea that the disadvantages of a long read time in comparison with a write time can at least in part be compensated by reading in parallel a plurality of data stored in the memory. Since a reading step of a plurality of data in parallel can be performed in about the same time as a reading step for one bit, a read operation, in which a larger amount of memory data is to be read, can be performed about as fast in a memory device with a long read time as a serial read operation in a memory device with a shorter read time.

The memory device of the invention comprises a read control unit coupled with the memory and adapted to read in parallel memory data from a plurality of sections or from all sections of the memory that are defined by address data contained in an incoming write request. To perform the read operation, the read control unit is preferably adapted to generate at least one read request comprising corresponding address data and send it to the memory.

"Reading in parallel" means that a plurality of data, such as bits, bytes or words, stored in a plurality of memory cells of the memory are read with at least a partial temporal overlap. Reading in parallel is hereinafter also referred to as a parallel-read operation. A memory section is in one embodiment one memory cell, in another embodiment a number of memory cells, such as a row or a column of memory cells or any other combination of memory cells.

A parallel-read operation needs about the same time for reading a plurality of data from the memory as a single read operation of one bit value from the memory. Therefore, the larger the number of data read in parallel and the larger the temporal overlap, the higher the gain in time in comparison with a serial read operation. In one embodiment reading from the different memory cells is performed at the same time, that means, with the largest temporal overlap that is technically possible. This further reduces the read time, especially for a large amount of memory data to be read.

In the memory device according to the first aspect of the invention, the memory data read in parallel is also received in parallel in the first temporary memory. Correspondingly, the first temporary memory has an input coupled with the memory that is adapted to receive in parallel a plurality of bit values. The first temporary memory preferably has short read and write times. For instance, an SRAM memory is used for the first temporary memory. There may be more than one first temporary memory.

Preferably, all memory data that are possibly changed by an incoming write request are read in one parallel-read operation. Where more than one first temporary memory is provided, for instance in the form of memory banks, data read may be sent in parallel to different memory banks. As an alternative, a number of parallel-read operations are performed in series to cover all memory data to be compared. In a preferred embodiment of the memory device of the first aspect of the invention, the read control unit is adapted to sequentially perform a number of parallel-read operations from memory sections of the memory, such that all sections defined by address data contained in an incoming write request are covered by the read operations. This embodiment is useful to serve write requests carrying a large amount of write data. The write data to be compared is dealt with in a number of working cycles.

The read control unit is preferably adapted to analyse whether the memory data to be read can be read in parallel with one parallel-read operation or not. If not, the read control unit generates an appropriate number of parallel-read requests to cover all data. Whether it is possible to read all data in one parallel-read operation or not depends not only on the amount of write data of an incoming write request, but also on the hardware design of the memory device and, in particular, on the width of the bus between the memory and the first temporary memory. In one embodiment there is a protocol restriction that limits address data in write requests to a range that can be read with one parallel-read operation. Write requests, which cannot be served with one parallel-read operation, are not allowed to be generated or are rejected by the memory device.

Preferably, the memory of the memory device is organized to enhance parallel read operations. For instance, the memory may be organized in memory banks that can be read in parallel. That means, different banks can be read in parallel. In another embodiment, each bank can be read in parallel. In yet another embodiment each bank as well as different banks can be read in parallel.

In a preferred embodiment the data connection between the memory and the first temporary memory is established by a wide data bus that allows transferring large amounts of data in parallel.

The memory device of the first aspect of the invention further comprises at least one second temporary memory that stores data received with an incoming write request. The second temporary memory preferably is also an SRAM memory.

A comparator unit is provided in the memory device of the first aspect of the invention. The comparator unit compares memory data stored in the first temporary memory with data stored in the second temporary memory and allocated to the same address information. The comparator unit provides an output indicative of the result of the respective comparison. The memory device has in different embodiments a comparator unit is adapted to perform the comparison bit by bit or byte by byte.

The output of the comparator unit can for instance be used to decide whether or not write data received with a write request and just compared to memory data shall be written to the memory. For instance, the output can be used to trigger a write control circuit that forwards the write data that has just been compared, from the second temporary memory to the memory, if the output of the comparator unit indicates that the write data is different from the corresponding memory data in the first temporary memory.

There is no need to wait with a parallel-read operation until all write data belonging to the write request is received. In an embodiment of the memory device of the invention, the read control unit is adapted to start a parallel-read operation immediately after receiving address data contained in the write request. This further accelerates the flow of the write request. In one form of this embodiment, address data is received through contacts separate from those for receiving write data. This allows triggering the parallel-read operation independently from the state of the input for write data. In another form of this embodiment, address data and write data are received through the same contacts. In this case the address data is typically sent in a predefined section at the beginning of the write request. Therefore, the read control unit detects the address data and triggers the parallel-read operation while write data are received.

Since it takes a comparably short time to store received write data in the second temporary memory, the parallel-read operation can at least in part be performed before filling the second temporary memory with write data. This causes only a small increase of the time needed for a write operation. On the other hand, this embodiment provides greater flexibility to an application that originates the write request. The application can send the write data of the write request independently from the address data that is used to perform the parallel-read operation of the data from the memory. This allows also making use of look-ahead and prefetching methods where the application can predict at what memory locations data will have to be written to before the actual values of those data are available.

Additional time is saved in a further embodiment, wherein the read control unit is adapted to read memory data into the first temporary memory while the comparator unit performs a comparison of write data stored in the second temporary memory with corresponding memory data in the first temporary memory.

In a further preferred embodiment of the memory device of the invention the second temporary memory has a storage capacity larger than that of the first temporary memory. Preferably, the ratio of the storage capacities of the first and second temporary memories is equal to or in the range of the ratio between the write time and the read time of the memory. For instance, if the write time to the memory is half the read time, the second temporary memory for write data is provided with a storage capacity twice as high as that of the first temporary memory for memory data. The additional storage capacity is in one form of this embodiment provided as an additional second temporary memory. In another form a single second temporary memory with a larger capacity is used.

In this embodiment, the second temporary memory has the storage capacity to be filled with new incoming write data while memory data are read into the first temporary memory or the conditional write is performed, i.e., while data of the first and second temporary memories are compared, or during both mentioned phases. The memory device is therefore available to receive new write data or new write requests from external memory clients before the second temporary memory is emptied. An example of a memory client is an application.

The memory device of the invention can in principle be used for any incoming data that is to be compared with memory data previously stored. In one embodiment the memory device is adapted to perform a write operation that involves providing a code, such as a password, with the write request. The memory device has the password in its memory and serves the write request only after establishing that the provided password is identical with the stored version. The write operation performed after verifying the password may be a conditional write operation. However, if a power-saving conditional write operation is not preferred, writing may be performed without comparing the write data with corresponding memory data in this embodiment.

In a preferred embodiment the memory device of the first aspect of the invention is adapted to perform a conditional write operation. Preferably, the memory device of this embodiment comprises a write control unit that is coupled with the comparator unit and the memory and that is adapted to serially write only that write data contained in the second temporary memory to the memory for which the output of the comparator unit indicates a difference to the corresponding memory data contained in the first temporary memory. A write operation that provides the data bit directly to the memory is also referred to as a direct write operation.

In an alternative embodiment implementing a toggle write operation the output of the comparator unit is used by the write control unit to generate a command to change the status of the respective memory cell or memory cells, if the output indicates that the compared data are different. The status of the memory cell corresponds to the information bit stored therein. A toggle write operation will change the stored information bit, for instance from "0" to "1", without providing the write data bit to the memory. In one embodiment a direct write operation or a toggle write operation can be performed.

The output provided by the comparator unit can in one embodiment be a binary signal that indicates "identical" or "not identical". In another embodiment the comparator unit generates an output only if compared data are different. This saves the step of interpreting the signal in the write control unit. The output is in this case for instance a write data bit just found to differ from the corresponding memory data bit, saving an additional step during the write operation. For a memory performing a toggle write, a further example of an output of the comparator unit is the address of the memory cell to be overwritten. This implies that the write controller does not obtain the address information through another channel.

To save further time, the read control unit is in another embodiment adapted to perform a parallel-read operation while the write control unit is performing one or several write operations.

In particular, the general idea of the present invention and the mentioned embodiments can be used for an MRAM device with a long read time compared to the write time, such as an MRAM device with a memory comprising 0T1MTJ memory cells. Due to the leakage problem, the read time of an 0T1MTJ memory is much longer than that of a conventional 1T1MTJ memory. The memory device of this embodiment is able to perform the reading step that is for instance comprised by a conditional write operation within a time span that for a large amount of data to be read can compete with that of series of read operations used in a prior-art 1T1MTJ device. This embodiment of the invention allows combining the advantages of a high cell density of an 0T1MTJ MRAM memory device with the reduced power consumption of a conditional write operation known from 1T1MTJ devices.

Therefore, the memory device of the first aspect of the invention allows making use of the advantages of a power-saving conditional write operation known from MRAM technologies with short read times in a memory technology that has a long read time, always in comparison to the respective write time. The larger the number of bits to be written to the memory, the better is the performance of the memory device of the invention in a write operation that involves a reading step in comparison with a memory device having a short read time. For a larger amount of write data the write time of the memory device of the invention can be made comparable to that of prior-art devices with short read times.

According to a second aspect of the present invention, a method is provided for comparing incoming data with memory data stored in memory sections of a memory, said memory having a longer read time than write time, comprising the steps of
a) receiving a write request comprising data and address information, said address information defining at least one memory section the write data is to be written to,
b) reading in parallel those data from a plurality of sections or from all sections of the memory that are defined by address data contained in the write request,
c) storing the read memory data in a first temporary memory,
d) storing at least a part of the data contained by the write request in a second temporary memory,
e) comparing the memory data contained in the first temporary memory with the corresponding data contained in the second temporary memory and allocated to the same address data,
f) providing an output indicative of the result of the comparison.

The method of the second aspect of the invention corresponds to the memory device of the first aspect of the invention. Therefore, all features and advantages mentioned there can be transferred to the method of the second aspect of the invention. In particular, the method allows to perform a conditional write operation also in a memory device with memory cells that have a longer read time than write time. This is achieved by reading in parallel those data from a plurality of sections or from all sections of the memory that are defined by address data contained in an incoming write request.

Preferred embodiments of the method of the second aspect of the invention correspond to those of the memory device of the first aspect of the invention.

One embodiment comprises a step of writing only those write data from the second temporary memory to the memory, which is different from the corresponding memory data. The writing step is in one embodiment performed as a direct-write or as a toggle-write operation.

In another embodiment steps b) and c) are performed in parallel with step d).

In a further embodiment a number of parallel-read operations (step b) from memory sections of the memory is performed, such that all sections defined by address data contained in the incoming write request are covered by the read operations.

In a further embodiment a parallel-read operation is performed immediately after receiving address data contained in the write request.

In a further embodiment write data are written serially from the second temporary memory to the memory.

In a further embodiment a parallel-read operation is performed while one or several write operations are performed.

Further features and advantages of the invention are described in the following with reference to the figures.

Figure 1:
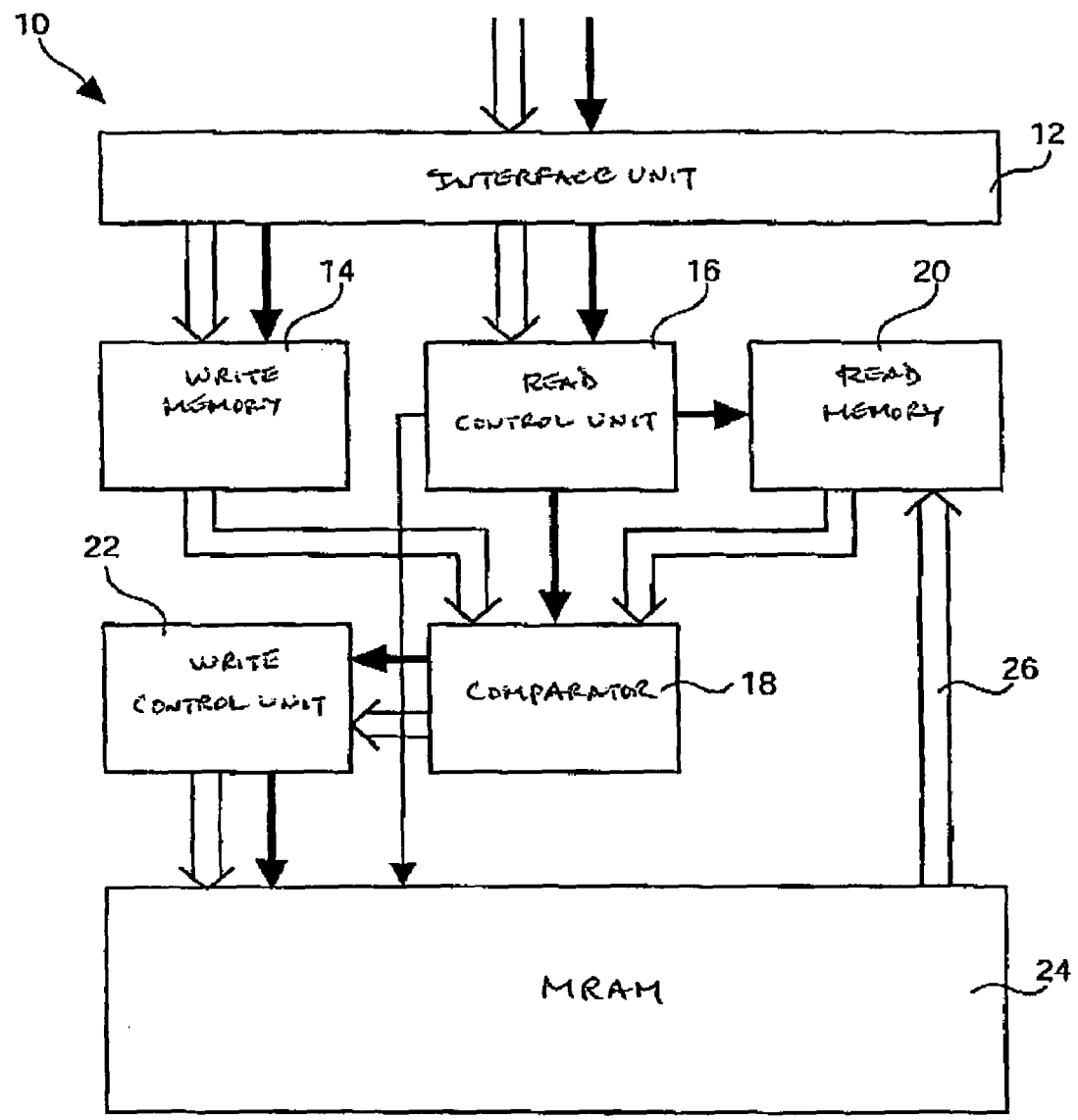
FIG. 1 is a simplified block diagram showing an embodiment of the memory device of the invention.

FIG. 1 shows a simplified block diagram of a memory device 10. The diagram only shows the structural elements and connections between them, that help to explain the invention to the person skilled in the art. However, it is evident to a person of ordinary skill in the art that this description contains enough information to enable a person of ordinary skill in the art to make use of the invention.

The memory device 10 has an interface unit 12 for communication with external memory clients. Interface unit 12 receives address data and write data contained in a write request originating at an external memory client through separate input ports.

Interface unit 12 is coupled with a write memory 14, herein also referred to as second temporary memory, and a read control unit 16. Write memory 14 is coupled with a comparator unit 18. Comparator unit 18 is coupled to the read control unit 16, to the write memory 14 and to a read memory 20, herein also referred to as first temporary memory.

Memory device 10 further comprises a write control unit 22 with an input coupled with the comparator unit 18 and an output coupled with a MRAM 24. It is noted that comparator unit 18 can be provided as an integral part of write controller 22. MRAM 24 has a matrix-like or, alternatively, a three-dimensional array of 0T1MTJ memory cells, such as those generally referred to as cross point memory cells. The memory 24 is organized into banks (not shown) that can be read in parallel. A connection between the MRAM 24 and the read memory 20 is established through a particularly wide data bus 26.

In operation, a write request containing write data and address data is received at interface unit 12. Arrows with a fat full line indicate the flow of address data in memory device 10. Address data is received through different contacts than write data. The address data is forwarded from interface unit 12 to read control unit 16. For reasons of simplicity we assume for the present example that the address data define an amount of memory data that can be read using one parallel-read operation. Read control unit 16 generates a corresponding read request from the address data and sends it to MRAM 24.

The memory data stored at the memory sections (cells) defined by the address data is then read out in parallel and sent in parallel to read memory 20. In an example, hundreds of bits are transferred in parallel through data bus 26.

The data read from memory 24 will have distortions of the true data due to the known leakage current problem of a memory based on 0T1MTJ memory cells. As a result, determining whether a particular memory data bit read from memory 24 is a zero or a one involves special processing that is responsible for the long read time of the device compared to a 1T1MTJ device.

As an example of a read processing method, the measured resistive values of a reading step are first stored in an intermediate read memory (not shown) coupled between memory 24 and read memory 20. The data in the intermediate read memory are then subjected to an evaluation process so as to determine the status (one or zero) of each memory cell. A simple example of an evaluation process is to read the memory data from memory 24, then change one bit in memory 24 and read the data again from memory 24. This can be used to determine whether the value of this bit was a one or a zero. The determined values can then be transferred from the intermediate read memory to memory 20 through data bus 26.

Read memory 20 has an input register adapted to receive in parallel the memory data read from MRAM 24. It then stores the data temporarily. It is noted that the parallel-read operation just described creates a parallel output of memory data from MRAM 24 that is sent in parallel from MRAM 24 to read memory 20. The memory data is stored in read memory 20 such that the allocation of the memory data to the corresponding address data is saved.

During the time the read memory 20 is filled with memory data, write memory 14 is filled with write data of the write request. The write data is stored in write memory 20 such that the allocation of the memory data to the corresponding address data is saved.

Since the time needed to write to memory 14 is much shorter than the time needed to read from MRAM 24, writing to write memory 14 may start later than reading from MRAM 24. The actual time write data is written to write memory 14 is controlled by the memory client sending the write request, or by an internal memory control unit (not shown), or both. A memory client can control the timing by first sending only address data to the memory device 10, and sending write data at a later point in time when it is convenient for the application. A memory control unit can block the reception of write data by indicating that the memory device is busy. This is useful for instance when write memory 14 is full.

As soon as there is write data in write memory 14 and memory data in read memory 20 that is allocated to the same address data, the write data and memory data are forwarded serially to from write memory 14 on one side and from read memory 20 on the other side to comparator unit 18. The bits received on the two data inputs of comparator unit 18 are compared.

In case a write bit and a corresponding memory bit are found to differ, the corresponding bit value received from write memory 14 is presented at the output of comparator unit 18 and is forwarded to write control unit 22 along with pertaining address data. Write control unit 22 overwrites the corresponding memory cell in MRAM 24 with the bit value received from comparator unit 18.

In case a write bit and a corresponding memory bit are found to be identical, there is no data output from comparator unit 18 to write controller 22.

In an alternative embodiment write memory 14 is directly coupled in parallel with MRAM 24, and with comparator unit 18. Write control unit 22 is further coupled to write memory 14. In operation, comparator unit 18 compares a bit value at the output of write memory 14 with a bit value at the output of read memory 20. If the bit values are found to differ, comparator unit 18 signals that result to write controller 22 which triggers overwriting of the corresponding memory cell of MRAM 24. Overwriting can be accomplished in a direct-write operation or in a toggle-write operation.

Figure 2:
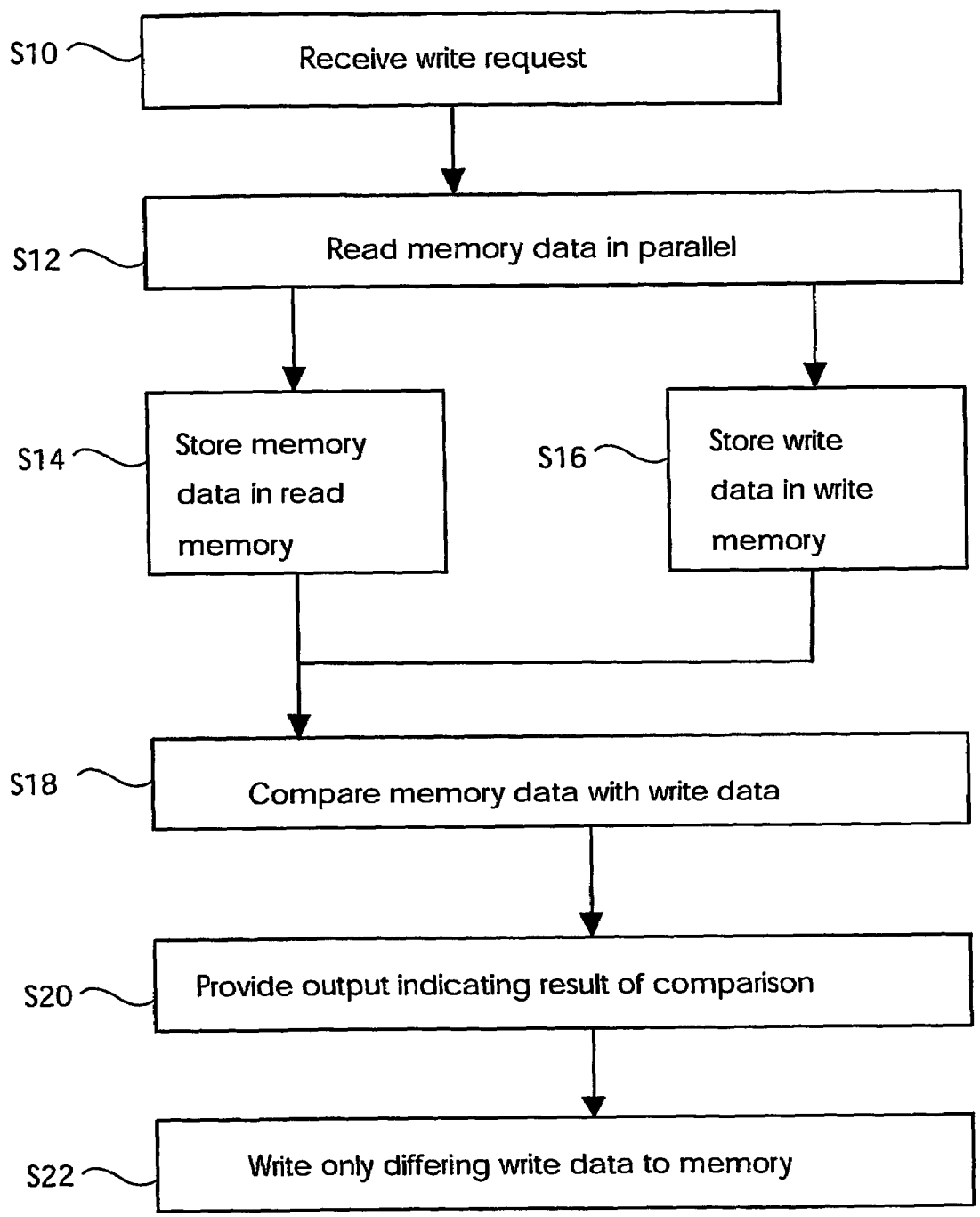
FIG. 2 is a flow diagram showing an embodiment of the method of the invention.

FIG. 2 shows a flow diagram of a writing method according to the invention. The method starts in a step S10 with the reception of a write request.

In a step S12 memory data are read in parallel from a plurality of sections or from all sections of the non-volatile memory that are defined by address information contained in the write request. A section of the memory is for instance a memory cell or a defined array of memory cells. It is noted that step S12 is performed as soon as address data is received. The memory device does not wait until a write request is completely received, but immediately starts the parallel-read operation.

In this embodiment, for the purpose of simplicity of the description, only write requests are dealt with that can be served using one parallel-read operation in the subroutine of the comparison of memory data with incoming write data.

In a step S14 the memory data read from the memory is stored in a first temporary memory. In a step S16 the write data of the write request is stored in a second temporary memory.

In a step S18 the memory data contained in the first temporary memory is compared with the corresponding write data contained in the second temporary memory and allocated to the same address information.

In a step S20 the result of the comparison is presented as an output. In a step S22, based on the output generated in step S20, only that write data from the second temporary memory is written to the memory, which is different from the corresponding memory data. Steps S18, S20, and S22 are performed serially, such as bit-by-bit or byte-by-byte.

The invention claimed is:

1. A memory device comprising a memory for storing memory data in memory sections allocated to address information, said memory having a long read time compared to a write time, a read control unit coupled with said memory and adapted to read memory data in parallel from a plurality of sections or from all sections of the memory that are defined by address information contained in an incoming write request, at least one first temporary memory adapted to receive in parallel and store memory data, at least one second temporary memory adapted to store at least a part of the data contained in the incoming write request directed to said memory, a comparator unit coupled with said at least one first and second temporary memories and adapted to compare memory data stored in the first temporary memory with data stored in the second temporary memory and allocated to the same address information, and to provide an output indicative of the result of the respective comparison.

2. The memory device of claim 1, wherein the read control unit is adapted to sequentially perform a number of parallel-read operations from memory sections of the memory, such that all sections defined by address information contained in the incoming write request are covered by the number of read operations.

3. The memory device of claim 1, wherein the read control unit is adapted to start a parallel-read operation immediately after receiving address data contained in the write request.

4. The memory device of claim 1, wherein the read control unit is adapted to perform a parallel-read operation while the comparator unit performs a comparison of write data stored in the at least one second temporary memory with corresponding memory data in the at least one first temporary memory.

5. The memory device of claim 4, wherein the at least one second temporary memory has a storage capacity that is larger than that of the at least one first temporary memory by a factor equal to the ratio of the read time and the write time.

6. The memory device of claim 1, comprising a write control unit that is coupled with the comparator unit and the memory and that is adapted to serially write only that write data to the memory for which the output of the comparator unit indicates a difference to the corresponding memory data contained in the first temporary memory.

7. The memory device of claim 6, wherein the write control unit is adapted to perform a write operation as a direct-write operation or a toggle-write operation.

8. The memory device of claim 6, wherein the read control unit is adapted to perform a parallel-read operation while the write control unit is performing one or several write operations.

9. The memory device of claim 1, wherein the memory comprises 0T1MTJ memory cells.

10. A method for comparing data stored in memory sections of a memory with incoming data included in a write request, said memory having a longer read time than write time, comprising the steps of a) receiving a write request comprising data and address information, said address information defining at least one memory section, b) reading in parallel the data from a plurality of sections or from all sections of the memory that are defined by address information contained in the write request, c) storing the memory data read in a first temporary memory, d) storing at least a part of the data contained by the write request in a second temporary memory, e) comparing the memory data contained in the first temporary memory with the corresponding data contained in the second temporary memory and allocated to the same address information, f) providing an output indicative of the result of the comparison.

11. The method of claim 10, comprising a step of writing only that write data to the memory, for which the output indicates a difference from the corresponding memory data.

12. The method of claim 11, wherein the writing step is performed as a direct-write or as a toggle-write operation.

13. The method of claim 10, wherein steps b) and c) are performed in parallel with step d).

14. The method of claim 10, wherein a number of parallel-read operations from memory sections of the memory is performed, such that all sections defined by address data contained in the incoming write request are covered by the number of read operations.

15. The method of claim 10, wherein a parallel-read operation is performed immediately after receiving address data contained in the write request.

16. The method of claim 10, wherein write data is written serially to the memory.

17. The meted of claim 10, wherein a parallel-read operation is performed while one or several write operations are performed.

18. The method of claim 10, performed in an MRAM memory with 0T1MTJ memory cells.

* * * * *